United States Patent [19]
Fischer et al.

[11] Patent Number: 5,617,030
[45] Date of Patent: Apr. 1, 1997

[54] METHOD AND APPARATUS FOR GRADIENT POWER SUPPLY FOR A NUCLEAR MAGNETIC RESONANCE TOMOGRAPHY APPARATUS

[75] Inventors: Hubertus Fischer, Bamberg; Stefan Nowak, Braeuningshof; Franz Schmitt, Erlangen, all of Germany

[73] Assignee: Siemens Aktiengesellschaft, Munich, Germany

[21] Appl. No.: 621,622

[22] Filed: Mar. 26, 1996

[30]       Foreign Application Priority Data

Mar. 30, 1995 [DE]  Germany ................... 19511832.4

[51] Int. Cl.$^6$ ................................................. G01V 3/00
[52] U.S. Cl. ............................................ 324/322; 324/318
[58] Field of Search .................................. 324/322, 318, 324/312, 313, 314, 307, 309, 300; 128/653.5

[56]            References Cited

U.S. PATENT DOCUMENTS 5,245,287  9/1993  Nowak et al. .................... 324/322
5,285,161  2/1994  Rzedzian et al. ................. 324/318
5,345,178  9/1994  Manabe et al. ................... 324/320
5,442,290  8/1995  Crooks .............................. 324/318
5,521,507  5/1996  Rohan et al. ...................... 324/318

*Primary Examiner*—Louis M. Arana
*Attorney, Agent, or Firm*—Hill, Steadman & Simpson

[57]               ABSTRACT

A gradient coil is connected to a controllable gradient amplifier via a first diagonal of a bridge circuit having four switches and unbiased diodes respectively connected parallel thereto. A capacitor that forms a resonant circuit together with the gradient coil is connected into the second bridge diagonal of the bridge circuit. A sinusoidal current is supplied through the gradient coil. Due to intentionally incomplete discharging of the capacitor at every other half-wave, an offset current can be superimposed on the sinusoidal current through the gradient coil.

7 Claims, 5 Drawing Sheets

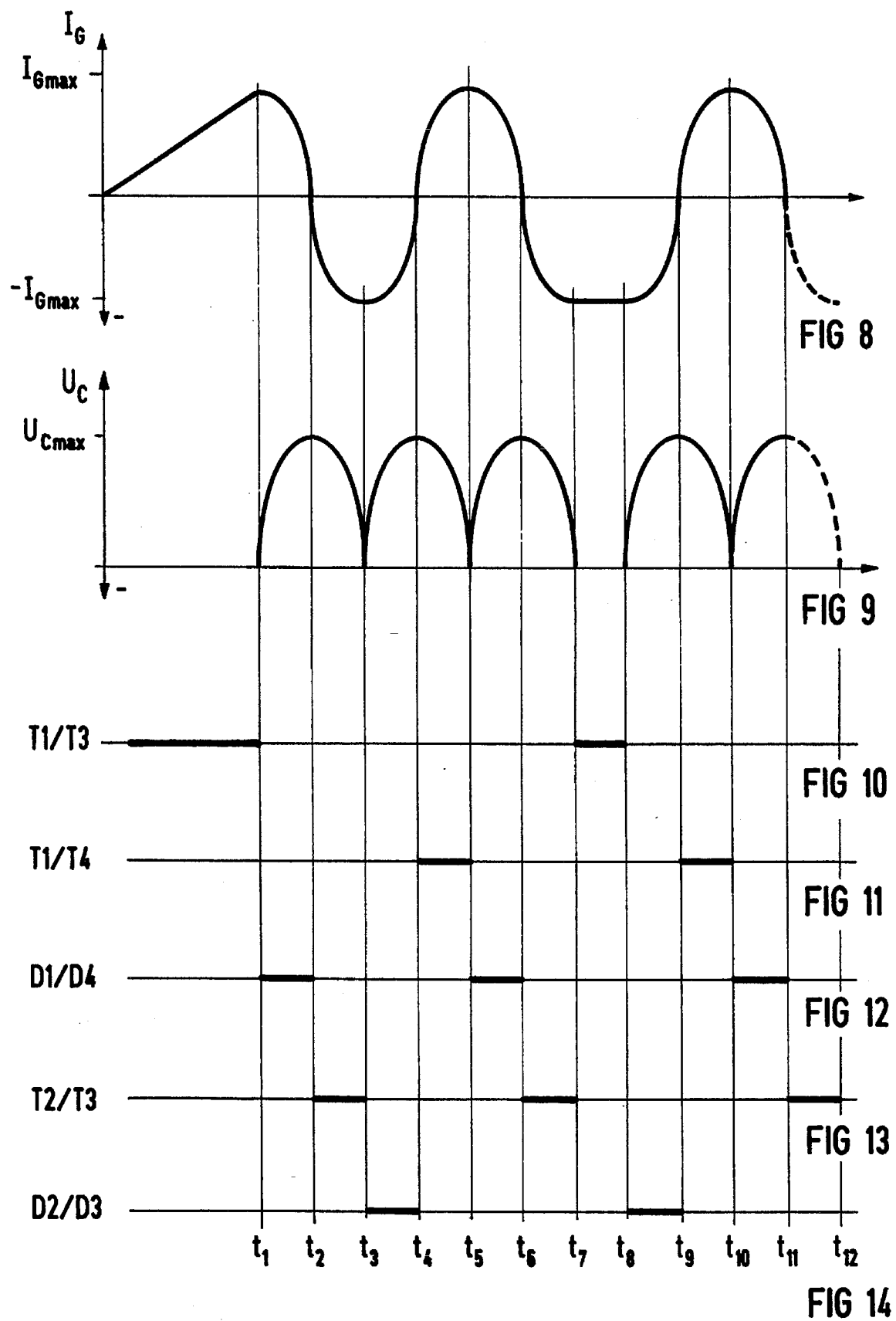

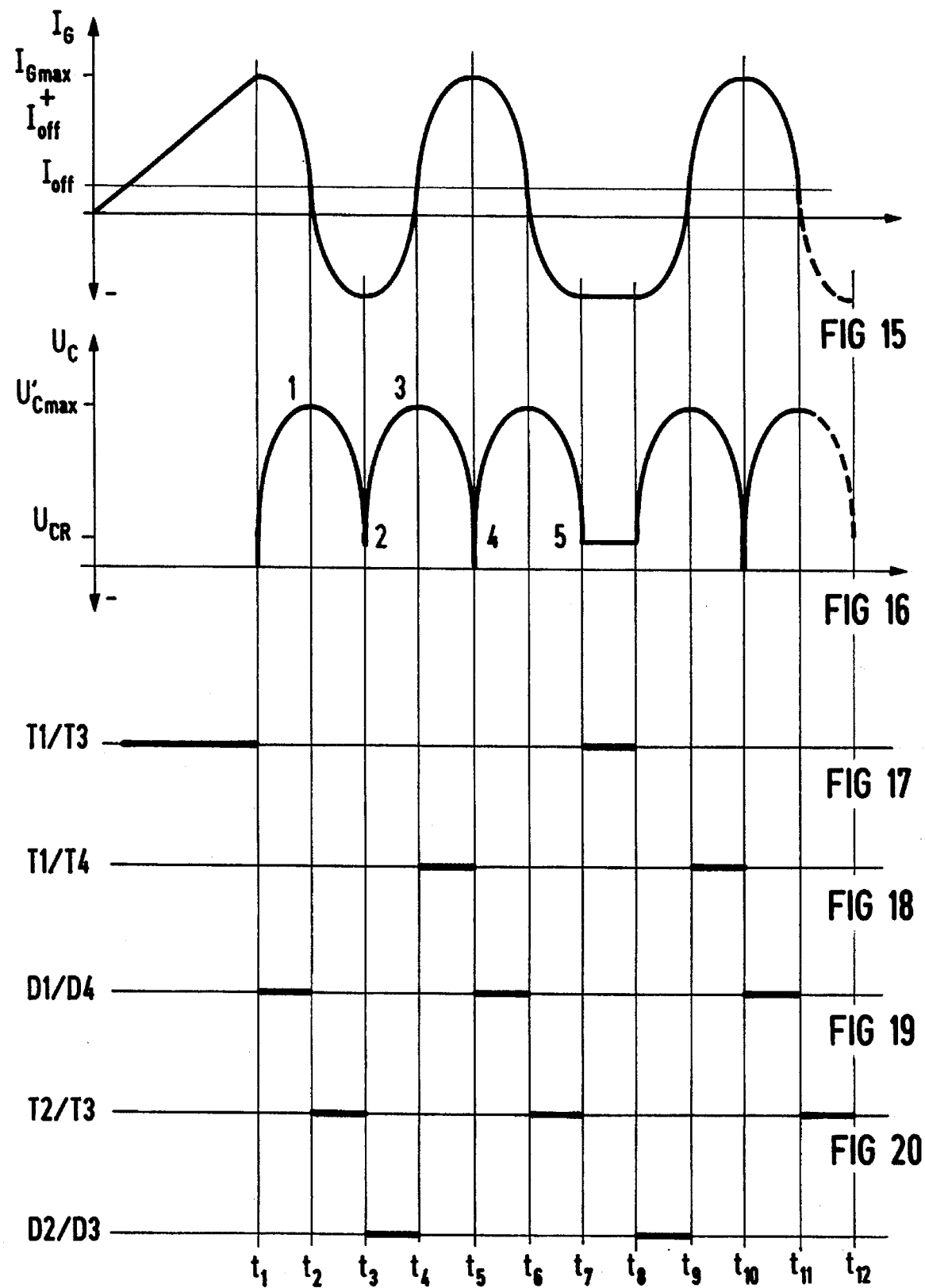

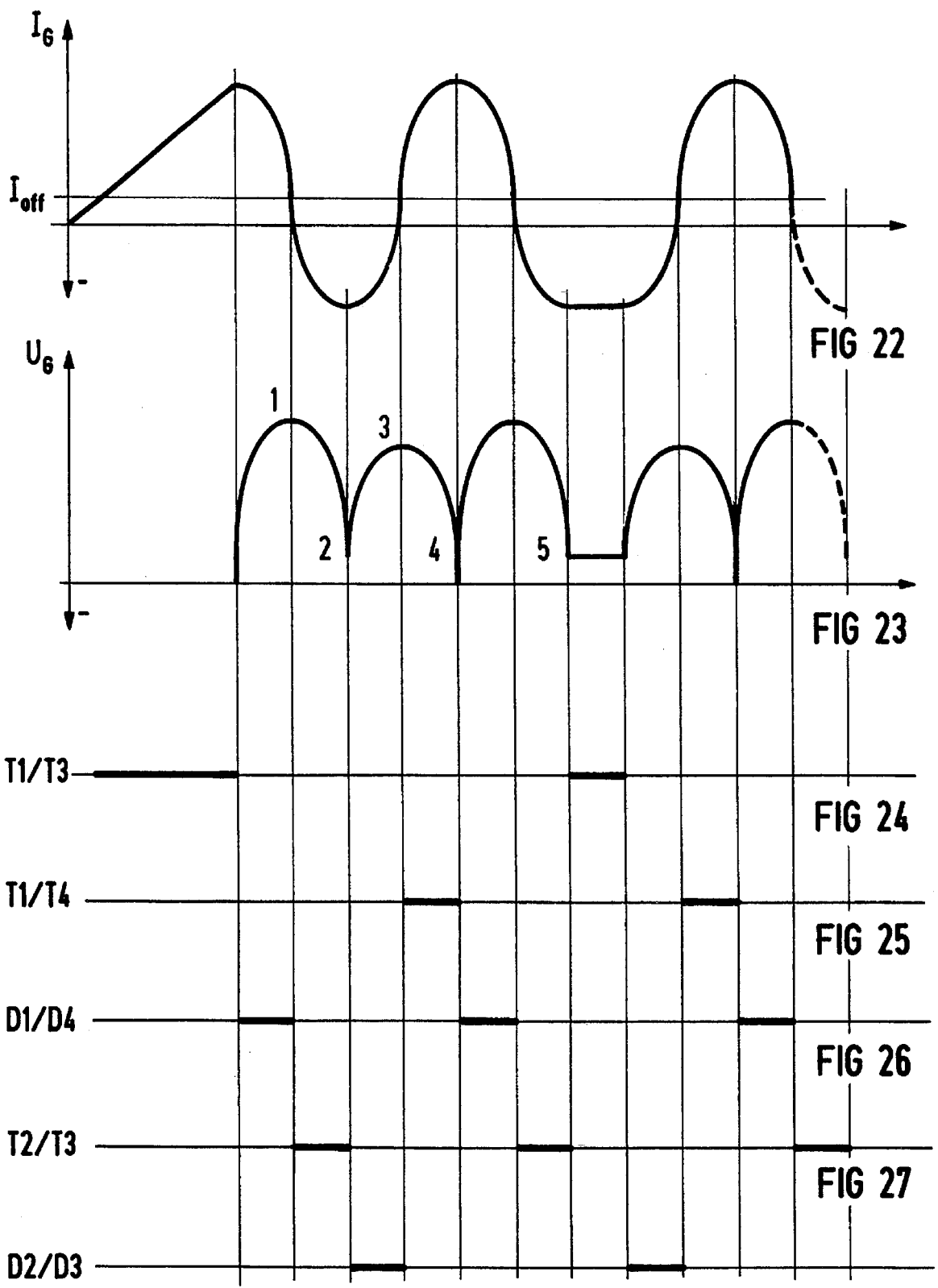

METHOD AND APPARATUS FOR GRADIENT POWER SUPPLY FOR A NUCLEAR MAGNETIC RESONANCE TOMOGRAPHY APPARATUS

BACKGROUND OF THE INVENTION

1. Field of the Invention

The present invention is directed to a method and apparatus for gradient power supply in a magnetic resonance imaging apparatus, for producing a gradient offset current.

2. Description of the Prior Art

U.S. Pat. No. 5,245,287 discloses a gradient power supply for a nuclear magnetic resonance tomography apparatus wherein the gradient coil is operated in a resonant circuit. Fast changes in current can be realized by the resonant operation of the gradient coil; these could not be realized with only a linear gradient amplifier or could be realized therewith with great outlay.

A setting possibility for shim currents is often provided in nuclear magnetic resonant tomography apparatus in order to improve the homogeneity. For example, this can be required before every measurement given high demands. Linear homogeneity terms can thereby be simply set in that a constant offset current is supplied to the gradient coils present for all three spatial directions in addition to the gradient power is predetermined by a sequence controller. This does not seem possible given operation of the gradient coil in a resonant circuit since, of course, the DC current cannot be conducted over a capacitor.

SUMMARY OF THE INVENTION

It is an object of the present invention to provide a method and an apparatus for gradient power supply wherein an offset current can also be set in resonant mode of the gradient coil.

The above object is achieved in a method and apparatus constructed and operating in accordance with the principles of the present invention wherein a bridge circuit is provided, having four switches, each switch being bridged by an unbiased diode and the bridge circuit having a first bridge diagonal and a second bridge diagonal containing a capacitor, a gradient coil being connected to the output of a controllable gradient amplifier through the first bridge diagonal, the capacitor and gradient coil thereby forming a resonant circuit. The four switches are operated in a sequence for producing an alternating current through the gradient coil as a gradient current. The gradient current is conducted across the capacitor and periodically charges and discharges the capacitor with the same voltage polarity. An offset current is generated through the gradient coil, superimposed on the gradient current, by operating the four switches so as to incompletely discharge the capacitor at every other half wave of the gradient current. The incomplete discharge of the capacitor produces a voltage at the gradient coil. The gradient amplifier is operated to compensate for an ohmic voltage drop across the gradient coil and the grid circuit, as well as to compensate for the voltage at the gradient coil produced by incompletely discharging the capacitor.

The offset current is preferably generated at a level which compensates for the linear terms of an inhomogeneity in the static magnetic field of the magnetic resonance tomography apparatus.

DESCRIPTION OF THE DRAWINGS

FIG. 8 shows the curve of the current $l_G$ in the gradient coil G in the circuit of FIG. 7 without the offset current.

FIG. 9 shows the corresponding curve of the voltage $U_C$ at the capacitor C in the circuit of FIG. 7 without the offset current.

FIGS. 10–14 respectively show the corresponding switching times for the switches T1–T4 and the diodes D1–D4 in the circuit of FIG. 7 without the offset current;

FIG. 15 shows the curve of the current $l_G$ in the gradient coil G in the circuit of FIG. 7 with the offset current $l_{OFF}$.

FIG. 16 shows the corresponding curve of the voltage $U_C$ at the capacitor C.

FIGS. 17–21 respectively show the corresponding switching times of the switches T1–T4 and of the diodes D1–D4 in the current of FIG. 7 with the offset current $l_{OFF}$;

FIG. 22 shows the curve of current $l_G$ for the switches being switched when the current $l_G$ has reached the offset current $l_{OFF}$.

FIG. 23 shows the corresponding curve $U_G$ for the switches being switched when the current $l_G$ has reached the offset current $l_{OFF}$.

FIGS. 24–28 respectively show the corresponding switching times of the switches T1–T4 and of the diodes D1–D4 for the switches being switched when the current $l_G$ has reached the offset current $l_{OFF}$.

DESCRIPTION OF THE PREFERRED EMBODIMENTS

Figure 1:
FIGS. 1–5 illustrate a known EPI sequence for explaining the problem which is solved by the present invention.
Figure 2:

The problem of fast gradient switching is especially pronounced in the EPI (echo planar imaging) method. This method is therefore explained in brief with reference to FIGS. 1 through 5. According to FIG. 1, an excitation pulse RF is emitted into the examination subject together with a gradient SS of FIG. 2 in the z-direction. Nuclear spins in a slice of the examination subject are thus excited. Subsequently, the direction of the gradient SS is inverted, whereby the negative gradient SS cancels the dephasing of the nuclear spins caused by the positive gradient SS.

Figure 3:
Figure 4:
Figure 5:

After the excitation, a phase-encoding gradient PC according to FIG. 3 and a readout gradient RO according to FIG. 4 are activated. The phase-encoding gradient PC is composed of short, individual pulses ("blips") that are activated at each polarity change of the readout gradient RO. The phase-encoding gradients PC are respectively preceded by a pre-phasing gradient PCV in negative phase-encoding direction.

Figure 6:
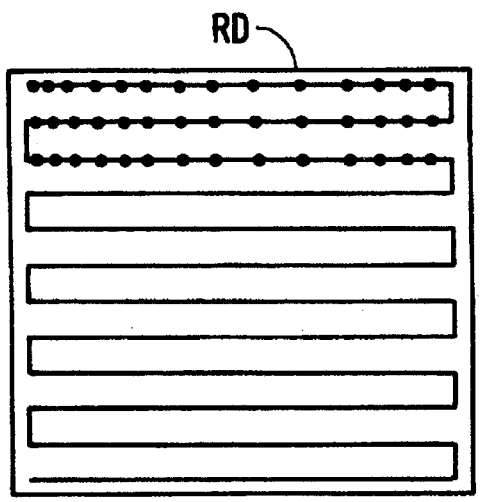
FIG. 6 shows the position of the sampled signals in the k-space given a sequence according to FIGS. 1–5.

The readout gradient RO is activated with periodically changing polarity, as a result of which the nuclear spins are dephased and in turn rephased in alternation. In a single excitation, so many signals are acquired that the entire Fourier k-space is sampled, i.e. the existing information suffices for reconstructing an entire tomogram. An extremely fast switching of the readout gradient with high amplitude is required for this purpose; this being virtually incapable of being realized with the square-wave pulses and conventional, controllable gradient amplifiers otherwise usually employed in MR imaging. A standard solution of the problem is to operate the gradient coil that generates the readout gradients RO in a resonant circuit, so that the readout gradient RO has a sinusoidal form. The arising nuclear magnetic resonance signals S are sampled in the time domain, digitized, and the numerical values acquired in this way are entered into a raw data matrix. The raw data matrix can be considered as being a measured data space, a measured data plane given the two-dimensional case of the exemplary embodiment. This measured data space is referred to as k-space in nuclear magnetic resonance tomography. The position of the measured data in the k-space is schematically illustrated by dots in FIG. 6. The information about the spatial origin of the signal contributions required for imaging is coded in the phase factors, whereby the relationship between the locus space (i.e., the image) and the k-space exists mathematically via a two-dimensional Fourier transformation. The following is valid:

$$S(k_x, k_y) = \iint \rho(x,y) e^{i(k_x x + k_y y)} \, dx \, dy$$

The following definitions thereby apply:

$$k_x(t) = \gamma \int_o^t G_x(t') dt'$$

$$k_y(t) = \gamma \int_o^t G_y(t') dt'$$

wherein
 $\gamma$=gyromagnetic ratio
 $\rho$=nuclear spin density
 $G_x$=value of the readout gradient RO
 $G_y$=value of the phase-encoding gradient PC Extremely high gradient amplitudes are required in the EPI method for the location encoding of the radio-frequency signals. These high gradient amplitudes must be activated and deactivated at short time intervals, so that the required information can be acquired before the nuclear magnetic resonance signal decays. If it is assumed that a pulse duration T of one millisecond is required for a projection (i.e. for an individual signal under an individual pulse of the readout gradient RO), an overall readout time $T_{acq}$ of 128 ms derives for a 128×128 image matrix. If one were to use conventional square-wave pulses having a duration of one millisecond and were to assume a field of view (FOV) of 40 cm, then typical gradient amplitudes $G_x$ for the readout pulse RO for square-wave pulses would be:

$$G_x = \frac{2\pi}{\gamma \delta t FOV} = 7.5 mT/m$$

Even larger gradient pulses $G_T$ derive for trapezoidal pulses having a rise time of $T_{rise}$=0.5 ms and without readout of the signals on the ramps.

$$G_T = G_R \frac{T}{T - T_{rise}} = 2G_R = 15 mT/m$$

The demands made on the electric strength of the gradient amplifier in the gradient power supply become increasingly problematical with decreasing rise time. If it is assumed that a current $l_{max}$ is required for reaching the maximum gradient strength $G_{max}$, then the voltage required due to an inductance L of the gradient coil is calculated as:

$$U = -L \frac{di}{dt}$$

The ohmic voltage drop at the gradient coil has not yet been taken into account. For an inductance of the gradient coil of 1 mH and a maximum current $l_{max}$ of 200 A, the voltage required at the output of the gradient amplifier would assume the following values dependent on the rise time $T_{rise}$ of the gradient current:

| | |
|---|---|
| $T_{rise}$ = 0.5 ms | U = 400 V |
| $T_{rise}$ = 0.25 ms | U = 500 V |
| $T_{rise}$ = 0.1 ms | U = 2000 V. |

Without a resonant circuit, these requirements can only be met with significant component outlay given short rise times; typically, at best by a parallel and series connection of modular gradient amplifiers.

The problem of the short switching times can be more simply solved when the gradient coil in question is operated together with a capacitor in a resonant circuit, whereby a sinusoidal curve of the readout gradient RO shown, for example, in FIG. 4 is then obtained. A disadvantage, however, is that an equidistant sampling in the k-space is not obtained in the sampling of the signal in temporally constant intervals, this being indicated in the raw data matrix RD by means of the non-equidistant dots in the k-space illustration of FIG. 6.

As initially mentioned, it is required in many instances to superimpose a constant gradient DC current on the actual gradient pulses, for the purpose of compensating linear inhomogeneity terms of the basic magnetic field.

Figure 7:
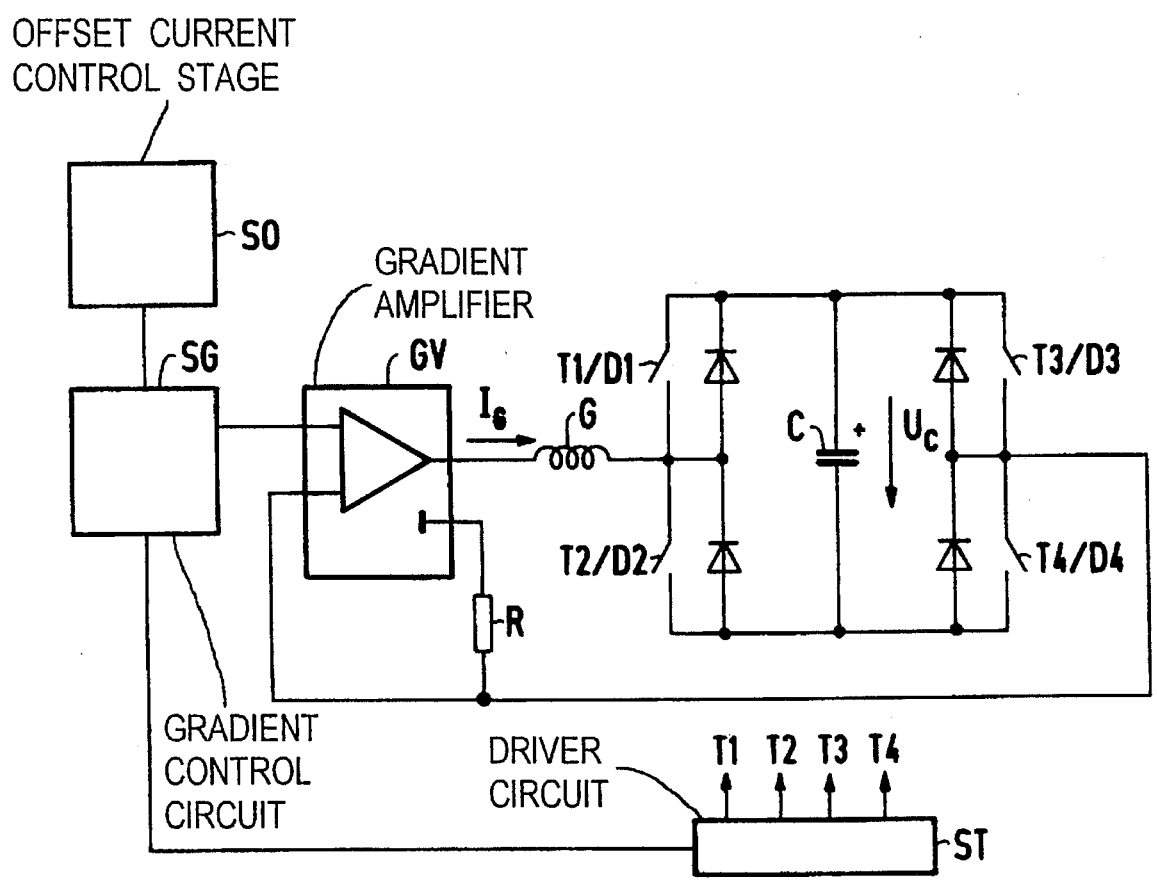
FIG. 7 shows an exemplary embodiment of a circuit arrangement constructed in accordance with the principles of the present invention.

FIG. 7 shows an exemplary embodiment of an inventive circuit wherein such offset currents can also be generated in the resonant mode, given an appropriate drive.

The gradient current $l_G$ is controlled by a gradient amplifier GV. This current flows in a series circuit composed of a gradient coil G and a bridge circuit, which is, in turn, composed of four switches T1–T4 with respective free-running (unbiased) diodes D1–D4 connected in parallel. This bridge circuit has a bridge diagonal lying in the current path of the gradient current $l_G$; a capacitor C lies in the other bridge diagonal. The gradient current $l_G$ is acquired and supplied to the gradient amplifier GV as an actual value. The current acquisition—as shown in the exemplary embodiment of FIG. 7—ensues most simply with a shunt resistor R in the current path.

A reference value for the gradient current $l_G$ is prescribed to the gradient amplifier GV by a gradient control circuit SG. This gradient control circuit SG also controls a driver circuit ST via which the individual switches T1–T4 are driven. The reference value of the current $l_G$ and the switching times for the switches T1–T4 are set dependent on a desired, selectable pulse sequence. An offset current is prescribed for the gradient control circuit SG by means of an offset current control stage SO. The offset current required for the compensation of a linear field inhomogeneity can be determined, for example, with a method as disclosed in U.S. Pat. No. 5,345,178.

FIGS. 8–14 show a switch control sequence and the curve of the gradient current $l_G$ resulting therefrom, as well as the voltage $U_C$ at the capacitor C, without offset current. In FIGS. 10–14, the darker, thicker portions represent times during which a switch is on or closed, or a diode is conducting (forward biased). According to FIG. 10, the switches T1 and T3 are thereby first switched on, so that a linearly rising current $l_G$ flows through the gradient coil G given a constant output voltage at the gradient amplifier GV. At time T1, switches T1 and T3 are opened. The inductive energy $$E_L = 2L \cdot l_{gmax}$$

is stored in the gradient coil G with the inductance L at this point in time. At time t1, the diodes D1 and D4 receive the current driven by the gradient coil G, so that the capacitor C is charged. The inductive energy stored in the gradient coil G has been fully transferred to the capacitor C at time $t_2$, so that, given a capacitance C, this stores the capacitive energy $E_C=2C \cdot U^2_{Cmax}$ is stored. During this time, the gradient current $l_G$ drop to zero and the voltage at the capacitor C proceeds to $U_{cmax}$. At time $t_2$, the switches T2, T3 are closed, so that the capacitor C is discharged and the stored energy is supplied to the gradient coil G. A negative current $l_G$ up to a maximum value $-l_{gmax}$ thereby flows. At time $t_3$, the entire energy has again been transferred from the capacitor C into the gradient coil G, so that the voltage $U_C$ drops to zero. At time $t_3$, the free wheeling diodes D2 and D3 receive the current driven by the gradient coil G, so that the capacitor C is again charged.

The illustrated switching cycle is continued, causing a sinusoidal curve of the gradient current $l_G$ to arise due to the charge transfer between capacitor C and gradient coil G. It is important, for the application of an offset current as described below, that the voltage at the capacitor C is unipolar, i.e. that the voltage $U_C$ fluctuates between zero and a positive maximum value $U_{cmax}$.

The above illustration proceeded on the basis of a loss-free resonant circuit. Ohmic losses are compensated by means of the gradient amplifier GV re-supplying the dissipated energy so that, given deviations between the actual value of the gradient current $l_G$ and the reference value thereof, the gradient amplifier GV supplies a voltage at its output that compensates the energy losses.

The bridge circuit of FIG. 7 also offers the possibility of connecting the gradient coil G directly to the gradient amplifier GV, bypassing the capacitor C, and thus driving a direct current of unlimited duration, which would not be possible in resonant mode. According to FIG. 14, this operating condition is achieved in that the switches T1 and T3 are switched on at time $t_7$. The previously existing current $l_G$ according to FIG. 8 thus continues to flow constantly, and only the ohmic voltage drop need be compensated with a corresponding voltage at the output of the gradient amplifier GV. Nothing regarding the charge condition of the capacitor C changes in this operating condition.

The possibility of having a direct current flow of unlimited duration through the gradient coil by closing the switches T1 and T3, however, is not suitable for generating the desired offset current, since this direct current cannot be superimposed on the alternating current in the resonant mode.

A drive of the circuit according to FIGS. 15–21, by contrast, is required for generating an offset current $l_{off}$. According to FIG. 17, the switches T1 and T3 are again closed first, and a linear current rise is generated at the gradient amplifier GV on the basis of a constant output voltage. Given the same, desired current amplitudes through the gradient G of 2 C $l_{gmax}$, a charging of the gradient coil up to the current $l_{gmax}+l_{off}$ is required here. The switches T1 and T3 are opened at time $t_1$ so that the current $l_G$ driven by the inductance of the gradient coil G now flows across the capacitor C and charges it. At time $t_2$, the gradient current $l_G$ has dropped to zero, and the inductive energy of the gradient coil G has been converted into capacitive energy in the capacitor C. Since the gradient coil was charged with a current which was higher by the offset current $l_{off}$ compared to the exemplary embodiment of FIG. 22, a higher voltage $U_{cmax}=$is also established. This condition is referenced 1 in FIG. 16.

At time $t_2$ of the zero-axis crossing of the gradient current $l_G$, the switches T2 and T3 are closed. The capacitor C is thereby in turn discharged and the gradient current $l_G$ rises, however, the discharge of the capacitor $U_C$ thereby does not ensue completely, since the switches T2 and T3 are already switched off at time $t_3$ at which time the capacitor C still has a residual charge, and thus a voltage $U_{CR}$. This condition is referenced 2 in the voltage diagram of FIG. 16. The energy stored in the capacitor C at time $t_2$ is thus not completely transferred into the gradient coil G.

When the switches T2 and T3 are switched off at time $t_3$, the diodes D2 and D3 become conductive. The current driven by the gradient coil G thereby flows across the capacitor C and again charges it. At time $t_4$ of the zero-axis crossing (i.e. at point 3 according to the voltage diagram of FIG. 16), the capacitor again has the same charge as at point 1, and thus again has the voltage $U_{cmax=}$, since the energy taken from the capacitor between $t_2$ and $t_3$ is exactly resupplied between $t_3$ and $t_4$.

The switches T1 and T4 are switched on at time $t_4$, so that a rising current is driven through the gradient coil $U_C$ by the voltage $U_C$ at the capacitor C. Since the same energy is available in the capacitor C at point 3 as at point 1, the current $l_{gmax}+l_{off}$ is again achieved in the gradient coil G until the capacitor voltage $U_C$ drops to zero at point 4 according to FIG. 16 at time $t_5$. The switching cycle thus begins again.

A characteristic of the described drive is that the capacitor voltage $U_C$ is allowed to proceed to zero only at every other half-wave, with a residual voltage $U_{ZR}$ remaining at the half-waves in between before the capacitor C is again charged by the current $l_G$ driven by the gradient coil G.

FIG. 16 shows that a gradient current $l_G$ is set with the described drive that is composed of a constant offset current $l_{off}$ as constant part and a superimposed alternating current part that has an approximate sinusoidal shape.

It is also possible in this operating case to connect the gradient coil directly to the gradient amplifier GV by switching on the switches T1 and T3 by driving the switches T1 and T3 of FIG. 17 in, for example, a time interval between $t_7$ and $t_8$. This permits an arbitrarily long direct current flow independently, of the sinusoidal current and the offset current.

Given the operation with offset current shown herein, the gradient amplifier GV, due to a deviation which may occur between the reference value and the actual value of the gradient current $l_G$, supplies a voltage at its output that is acquired in addition to the resonant circuit, for example for compensating ohmic losses.

FIGS. 22–28 show current and voltage curves as well as switching states for that case wherein the switching of the switches T1–T4 does not ensue at the point in time of the zero-axis crossing of the gradient current $R_G$, but instead when the gradient current $l_G$ reaches the offset current $l_{off}$, i.e. when it would pass through zero without taking the offset current $l_{off}$ into consideration. Given direct drive by a gradient current control circuit, this can be simpler since the actual zero-axis crossing need not be acquired.

The charging event by the switches T1 and T3 and the transfer of the current by the diodes D1 and D4 ensues as in the exemplary embodiment set forth before. The switches T2 and T3, however, are switched on somewhat earlier and the switches T1 and T4 are switched on somewhat later than in the above-described exemplary embodiment. This leads to the fact that the maximum voltage in every other half-wave (i.e. in the point 3 in the voltage diagram of FIG. 23) is somewhat lower than in the other half-waves (i.e. in point 1 in the exemplary embodiment). As in the preceding exemplary embodiment, the turn-off time of the transistors T2 and T3 is selected such that the voltage $U_C$ at the capacitor C does not proceed entirely to zero in every other half-wave (i.e., for example, in points 2 and 5 according to the voltage diagram of FIG. 23). The setting of an offset current $1_{off}$ is thus also possible with this drive.

With the described arrangement, one thus surprisingly succeeds in setting a constant DC part of the gradient current $1_G$, i.e. an offset current $1_{off}$, even in resonant operation of a gradient coil. Linear inhomogeneity terms in the three spatial directions of a magnet can thus be corrected by means of the gradient coils. Separate shim coils are not required for this compensation. The amplitude of the offset current is in fact limited since the capacitor C must also be discharged to a certain extent in every other half-wave (i.e., in the points 2 and 5 according to FIG. 16 and 23). In practice, however, the offset currents are far lower than the gradient pulses so that the range of adjustment is completely adequate for the offset current $1_{off}$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a gradient offset current in a nuclear magnetic resonance tomography apparatus comprising the steps of:

providing a bridge circuit having four switches, four unbiased diodes respectively connected in parallel with said four switches, a first bridge diagonal, and a second bridge diagonal containing a capacitor;

providing a gradient coil and a controllable gradient amplifier and connecting said gradient coil to an output of said gradient amplifier through said first bridge diagonal, said capacitor and said gradient coil thereby forming a resonant circuit;

operating said four switches in a sequence for producing an alternating current through said gradient coil as a gradient current having alternating positive and negative half-waves, said gradient current being conducted across said capacitor and periodically charging and discharging said capacitor with a same voltage polarity;

generating an offset current through said gradient coil superimposed on said gradient current by operating said four switches for incompletely discharging said capacitor at every other half-wave of said gradient current, the incomplete discharge of said capacitor producing a voltage at said gradient coil; and operating said gradient amplifier for compensating for an ohmic voltage drop across said gradient coil and said bridge circuit and for compensating for said voltage at said gradient coil produced by incompletely discharging said capacitor.

2. A method as claimed in claim 1 wherein said nuclear magnetic resonance tomography apparatus employs a basic magnetic field having an inhomogeneity characterizable by linear terms, and comprising the additional step of compensating said linear inhomogeneity terms by said gradient offset current.

3. A method as claimed in claim 1 wherein the step of generating an offset current includes beginning each charging and discharging of said capacitor each time said gradient current with said offset current superimposed thereon passes through zero.

4. A method as claimed in claim 1 wherein the step of generating an offset current includes beginning each charging and discharging of said capacitor each time said gradient current passes through zero.

5. A method as claimed in claim 1 comprising the additional step of conducting a measuring sequence in said nuclear magnetic resonance tomography apparatus and, before beginning said measuring sequence, supplying said gradient coil with a current with said capacitor discharged that is equal to a maximum amplitude of said gradient current with said offset current superimposed thereon.

6. A method as claimed in claim 1 wherein two of said switches in said bridge circuit form a bridge half, and comprising the step of:

closing said two switches of said bridge half and supplying said gradient coil with a constant current from said gradient amplifier directly through said two switches of said bridge half and bypassing said capacitor.

7. In a nuclear magnetic resonance tomography system, the improvement of an apparatus for generating a gradient offset current comprising:

a bridge circuit having four switches, four unbiased diodes respectively connected in parallel with said four switches, a first bridge diagonal, and a second bridge diagonal containing a capacitor;

a controllable gradient amplifier having an output;

a gradient coil connected to said output of said gradient amplifier through said first bridge diagonal, said capacitor and said gradient coil thereby forming a resonant circuit;

means for operating said four switches in a sequence for producing an alternating current through said gradient coil as a gradient current having alternating positive and negative half-waves, said gradient current being conducted across said capacitor and periodically charging and discharging said capacitor with a same voltage polarity;

means for generating an offset current through said gradient coil superimposed on said gradient current by operating said four switches for incompletely discharging said capacitor at every other half-wave of said gradient current, the incomplete discharge of said capacitor producing a voltage at said gradient coil; and means for controlling said gradient amplifier for compensating for an ohmic voltage drop across said gradient coil and said bridge circuit and for compensating for said voltage at said gradient coil produced by incompletely discharging said capacitor.

* * * * *